United States Patent [19]

Sondermeyer

[11] 4,290,335

[45] Sep. 22, 1981

[54] HIGH FREQUENCY ROLL-OFF CIRCUIT

[76] Inventor: Jack C. Sondermeyer, P.O. Box 2898, Meridian, Miss.

[21] Appl. No.: 124,470

[22] Filed: Feb. 25, 1980

[51] Int. Cl.³ ............................................. G10H 1/02
[52] U.S. Cl. ..................................... 84/1.27; 84/1.19; 328/167; 333/28 T; 179/1 D; 179/1 VL
[58] Field of Search ............... 84/1.19, 1.27; 179/1 D, 179/1 F, 1 VL; 455/233; 307/295; 330/305; 328/167, 175; 333/28 T

[56] References Cited

U.S. PATENT DOCUMENTS

| | | | |
|---|---|---|---|
| 3,182,271 | 5/1965 | Aiken | 179/1 VL |
| 4,002,994 | 1/1977 | Fender | 179/1 D |
| 4,101,840 | 7/1978 | Fricke et al. | 179/1 VL |
| 4,141,269 | 2/1979 | Itakura | 84/1.27 |

Primary Examiner—B. Dobeck
Assistant Examiner—Forester W. Isen
Attorney, Agent, or Firm—Victor J. Evans & Co.

[57] ABSTRACT

A high frequency roll-off circuit for a gain stage including an amplifier having a feedback network together with a dual potentiometer comprising two serially connected gang operated resistors connected between the amplifier feedback port and through a capacitor to the amplifier output port, one of the resistors forming a volume control and the other resistor forming a high frequency roll-off control whereby at high volume settings, high frequency roll-off is automatically provided.

5 Claims, 4 Drawing Figures

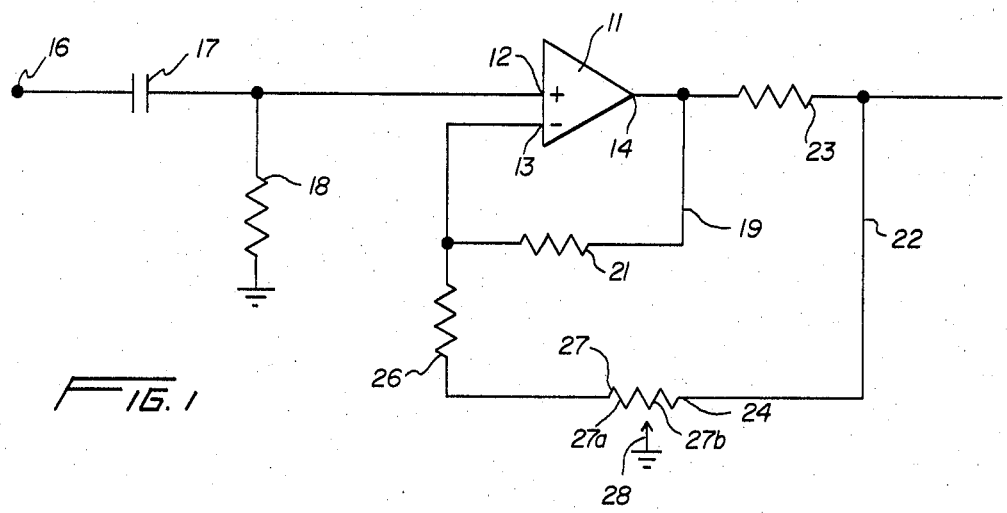
FIG. 1
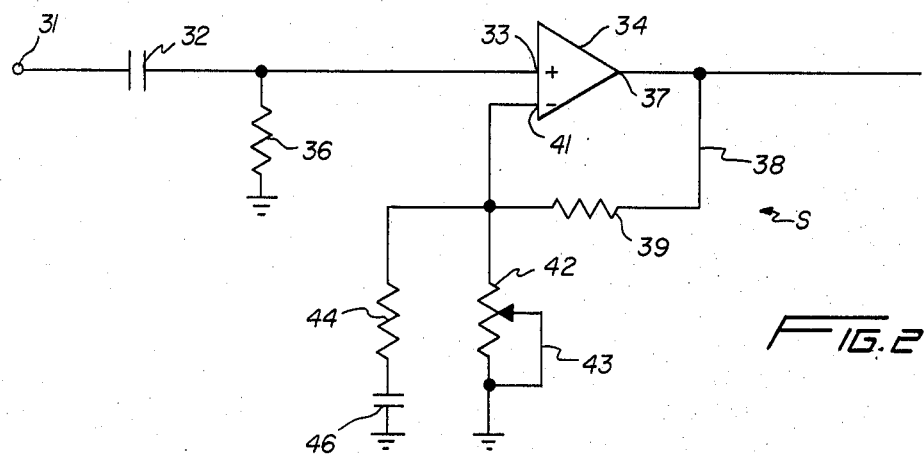
FIG. 2
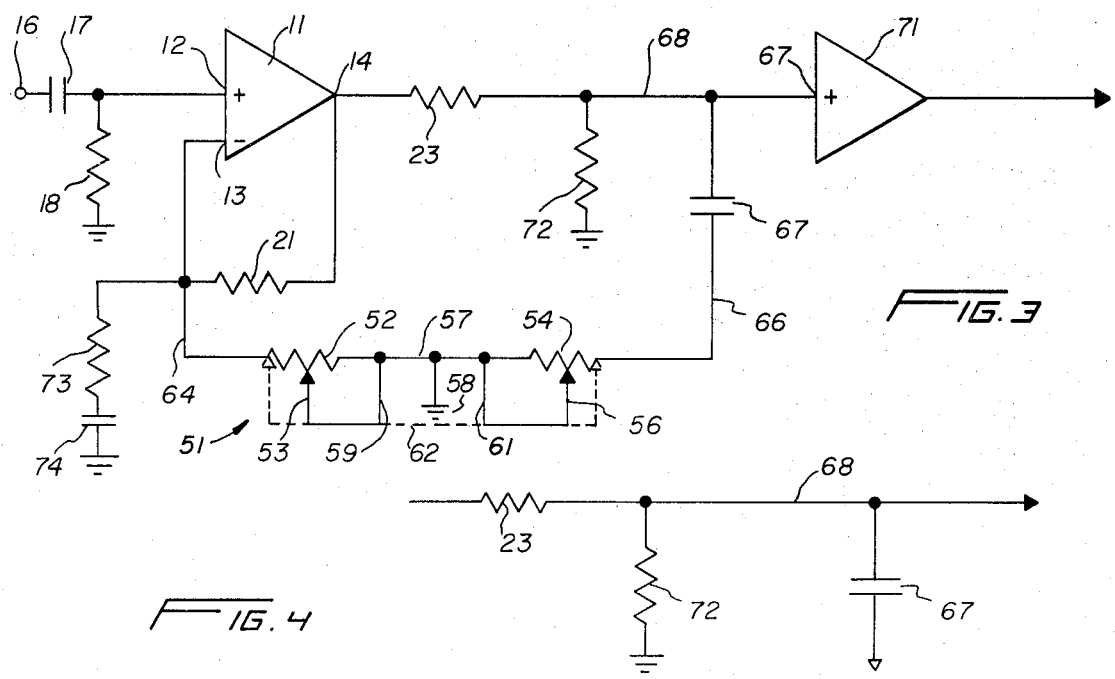
FIG. 3
FIG. 4

HIGH FREQUENCY ROLL-OFF CIRCUIT

BACKGROUND OF THE INVENTION

In amplifier systems for musical instruments such as guitars or the like, most present day guitar preamplifier circuits utilize a variable feedback type circuit. The advantages of such a variable feedback type circuit include relatively wide dynamic range (more than 3 volts RMS for input overload), high input impedance, and good noise.

At normal guitar settings (12:00), the overall low frequency (L.F.) gain is approximately 18, and the high frequency gain (H.F.) is approximately 120. This high frequency boost is needed to properly equalize a guitar system (primarily speaker roll-off and the guitar system itself). Contemporary music now dictates a good front end overload condition which is accomplished by operating the volume at a maximum setting ("10") and by controlling the level with a post volume control. The resulting gains at such maximum volume setting are a L.F. gain of approximately 240 and a H.F. gain of approximately 1,600.

Generally a gain of at least 200 is required for smooth distortion effects but the excessive high frequency boost referred to above is not needed and usually causes intense high frequency oscillations and instability, as well as making the sound quality harsh or sharp sounding. Obviously a system which would reduce the high frequency boost at high volume settings would be desirable.

OBJECTS AND SUMMARY OF THE INVENTION

Accordingly, a primary object of this invention is to provide a new and novel high frequency roll-off circuit for guitar amplifiers and the like.

Another object of this invention is to provide a new and novel high frequency roll-off circuit for an amplifier such as a guitar amplifier which automatically provides a high frequency roll-off at high volume settings to produce an audio output free of distortion and instability.

A further object of this invention is to provide a new and novel high frequency roll-off circuit for guitar amplifiers and the like which permits the production of music from an amplifier system which is pleasing to the ear at maximum volume settings but which permits the guitar amplifier to automatically return to the high frequency boost mode at lower volume settings.

Still another object of this invention is to provide a new and novel high frequency roll-off circuit for a guitar amplifier which is simple and inexpensive in construction, which utilizes readily available components and which may be easily and inexpensively incorporated in present day amplifier systems for guitars and the like to provide vastly improved operation of the guitar amplifier.

The objects of the invention and other related objects are accomplished by the provision of a gain stage which includes an amplifier having a feedback port, an input port and an output port with a feedback network connected between the output port and the feedback port of the amplifier. Means are provided for feeding an input signal to the input port of the amplifier and a volume control means are connected between the output port and the feedback port of the amplifier. High frequency roll-off control means are connected between the volume control means and the output port with the volume control means and high frequency roll-off control being operatively interconnected for mutual adjustment to thereby attenuate the high frequency roll-off available at the maximum setting of the volume control means. Other objects and features of the invention will become apparent from the following description taken in connection with the accompanying drawings in which:

BRIEF DESCRIPTION OF THE DRAWINGS

FIG. 1 is a circuit diagram of a conventional prior art guitar preamplifier;

FIG. 2 is a circuit diagram of a prior art gain stage employed following the front end stage in a guitar amplifier system;

FIG. 3 is a circuit diagram of the circuit diagram of FIG. 1 incorporating the high frequency roll-off circuit of the invention; and FIG. 4 is a schematic representation of the high frequency roll-off circuit of FIG. 3 when the volume control is at a maximum.

DESCRIPTION OF THE PREFERRED EMBODIMENT

Referring now to the drawings and to FIG. 1 in particular there is shown a present day preamplifier circuit which is of the variable feedback type. The prior art circuit of FIG. 1 includes an internal operational amplifier 11 having a noninverting input port 12, an inverting port 13 and an output port 14. Means are provided for feeding an input signal to the input port 12 of the amplifier 11 from terminal 16 which include a coupling capacitor 17 and a resistor 18 connected at one side between the capacitor 17 and the input port 12 and at the other side to ground. The resistor 18 determines the input impedance of the preamplifier of FIG. 1. The amplifier 11 includes a feedback network including a conductor 19 for connecting the output port 14 of the amplifier 11 through a resistor 21 to the feedback port 13. A volume control circuit is provided for the preamplifier of FIG. 1 which includes a conductor 22 for connecting the output port 14 of the amplifier 11 through a resistor 23, a potentiometer 24 and a gain limiting resistor 26 to the feedback port 13 of the amplifier 11. The potentiometer 24 includes a resistor 27 and a wiper 28 connected to ground for controlling the volume of the preamplifier of FIG. 1. The portion of the resistor 27 between the wiper 28 and resistor 26 is identified hereinafter by the reference 27a and the portion of the resistor 27 between the wiper 28 and the resistor 23 is identified hereinafter by the reference numeral 27b.

The gain of the op amp 11 is determined by the following equation:

$$\text{Gain}_I = \frac{R_{21}}{R_{27a} + R_{26}} + 1$$

In accordance with the above equation, resistor 21 is a fixed resistor, resistor 27a is the value of the volume pot 24 from the wiper 28 to the feedback side of the amplifier 11 and resistor 26 is the gain limiting resistor when the volume is set at a maximum setting.

Typical values yield an internal gain situation as follows:

Gain approximately 3.2 at "0" volume control setting
Gain approximately 3.4 at "1" volume control setting Gain approximately 5 at "5" volume control setting
Gain approximately 40 at "10" volume control setting The total gain stage of the preamplifier of FIG. 1 is determined by the loading effect of resistance 27b on resistor 23 in accordance with the following equation:

$$\text{Stage Gain} = \text{Gain}_I \times \frac{R_{27b}}{R_{23} + R_{27b}}$$

As explained above, resistance 27b is the value of the volume pot 24 from the wiper 28 to the output end of the amplifier 11 and resistor 23 is a fixed resistor.

Typical values in the circuit of FIG. 1 yield a total gain situation as follows:
Gain approximately 0 at "0" volume control setting
Gain approximately 1 at "1" volume control setting
Gain approximately 3 at "5" volume control setting
Gain approximately 40 at "10" volume control setting Referring to FIG. 2 there is shown a prior art gain stage for a guitar amplifier which is identified by the letter S and which is usually utilized following the front end stage of the amplifier. In the gain stage S of FIG. 2, the input signal at terminal 31 is fed to the non-inverting input port 33 of an amplifier 34 and a resistor 36 forming an input drain for the operational amplifier 34 is connected on one side between the capacitor 32 and the input port 33 and on the other side to ground. The op amplifier 34 has an output port 37 and a feedback network including a conductor 38 for connecting the op amp output port 37 through a resistor 39 to the inverting or feedback port 41 of the op amp 34. The feedback port 41 of the op amp 34 is connected through a potentiometer 42 having a wiper 43 to ground. Also, a high frequency boost (RC) circuit is connected to the feedback port 41 which includes serially connected resistor 44 and capacitor 46 connected to ground as shown.

The gain of the gain stage S of FIG. 2 is as follows:

$$\text{Gain } (L.F.) = \frac{R_{39}}{R_{42}} + 1 \text{ (approximately 6)}$$

$$\text{Gain } (H.F.) = \frac{R_{39}}{R_{44}} \text{ (approximately 40)}$$

As specifically illustrative of the invention, reference is made to the circuit diagrams of FIGS. 3 and 4 wherein like numerals are used to identify like parts. As shown in FIG. 3, a dual potentiometer designated generally by the numeral 51 is substituted for the volume potentiometer 24 in the circuit of FIG. 1. The potentiometer 51 includes a variable resistor 52 having a wiper 53 which resistor 52 is serially connected with a variable resistor 54 having a wiper 56. The resistors 52, 54 are connected together by means of a conductor 57 grounded at 58 and each of the wipers 53, 56 are connected by means of conductors 59, 61 respectively to conductor 57. The variable resistors 52, 54 are interconnected for mutual adjustment or gang operation as indicated by the broken lines 62 so that the wipers 53, 56 move together to add or subtract the amount of resistance in the circuit provided by each of the resistors 52, 54 in the same direction or to the same extent. Any suitable control knob or the like (not shown) may be used to move the wipers 53, 56 together and, by way of example, the movement of such a control knob in one direction such as C W direction decreases the amount of resistance in the circuit equally provided by the two resistors 52, 54 as indicated by the arrows. In the illustrated embodiment, variable resistor 52 forms a volume control means and variable resistor 54 forms high frequency roll-off control means.

The dual potentiometer 51 is connected into the circuit of FIG. 3 by connecting one side of the variable resistor 52 to the non-inverting or feedback port 13 of the op amp 11 by means of conductor 64. The corresponding side of variable resistor 54 is connected by means of conductor 66 to one side of a capacitor 67 the other side of which is connected to conductor 68 connected between resistor 23 and the input port 69 of a clipping stage which includes an amplifier 71. A resistor 72 grounded on one side is connected at its other side to conductor 68 between resistor 23 and said other side of capacitor 67. Preferably an R C high frequency boost circuit comprising a resistor 73 and a serially connected capacitor 74 grounded on one side is provided which is connected by conductor 64 to the feedback port 13 of the op amp 11.

When the wiper 53 of the variable resistor 52 forming the volume control means is in its leftmost position as shown by the broken lines in FIG. 3, the wiper 56 of the variable resistor 54 forming the high frequency roll-off control means is in its rightmost position as similarly indicated by the broken lines in FIG. 3. In this position of the wiper 53 of the volume control means, the volume control is at a maximum and the amount of resistance of the variable resistor 54 in the circuit of FIG. 3 is zero resulting in the high frequency roll-off circuit schematically shown in FIG. 4. Thus, as can be seen by reference to FIG. 4, this circuit automatically provides the high frequency roll-off because capacitor 67, which may have a value of approximately 0.1 uf, provides 6 dB per octave roll-off above approximately 1,000 cycles. This roll-off action is automatic when the wiper 53 of the variable resistor 52 is in the broken line position of FIG. 3 with the volume control in its maximum position. With volume settings of less "8", the capacitor 67 is effectively removed from the circuit of FIGS. 3, 4 by the increased value of variable resistor 54 so that the amplifier system in FIGS. 3, 4 is returned to its normal high frequency boost mode.

What is claimed is:

1. A high frequency roll-off circuit for a gain stage in an amplifier system, comprising, in combination, an amplifier having a feedback port, an input port and an output port, means for feeding an input signal to said input port, a feedback network connected between said output port and said feedback port, volume control means having two terminals, one of said terminals being connected to said feedback port, high frequency roll-off control means having two terminals, one of which is connected through a capacitor to said output port, the other terminals of said high frequency roll-off control means and said volume control means being connected to ground, said volume control means and said high frequency roll-off means being mechanically ganged for mutual adjustment to reduce the high frequency boost at the maximum setting of said volume control means.

2. A high frequency roll-off circuit in accordance with claim 1 wherein said volume control means and said high frequency roll-off control means comprise a dual potentiometer, including a pair of variable resistors each forming one of said control means arranged for gang operation whereby the resistance of each of said pair of resistors may be varied together in the same direction.

3. A high frequency roll-off circuit in accordance with claim 2 including a clipping stage having an input port connected to said amplifier output port.

4. A high frequency roll-off circuit in accordance with claim 3, including a first resistor for connecting said amplifier output port to said clipping stage input port, said capacitor being connected on one side between said first resistor and said clipping stage input port and on the other side to said variable resistor forming said high frequency roll-off control means, there being a second resistor connected between the junction of said first resistor and said capacitor and ground.

5. A high frequency roll-off circuit in accordance with claim 4 including a serially connected resistor and capacitor connected between said amplifier feedback port and ground for a high frequency boost mode operation of said amplifier.

* * * * *